United States Patent [19]
Huang et al.

[11] Patent Number: 6,001,414
[45] Date of Patent: Dec. 14, 1999

[54] DUAL DAMASCENE PROCESSING METHOD

[75] Inventors: Yimin Huang, Taichung Shien; Hsiao-Pang Chou, Hsinten; Tri-Rung Yew, Hsinchu Shien, all of Taiwan

[73] Assignee: United Microelectronics Corp., Hsin-Chu, Taiwan

[21] Appl. No.: 08/991,193

[22] Filed: Dec. 16, 1997

[30] Foreign Application Priority Data

Sep. 8, 1997 [TW] Taiwan .................................. 86112919

[51] Int. Cl.[6] ........................................................ B05D 5/12
[52] U.S. Cl. ............................ 427/96; 427/509; 427/510; 427/585; 427/588; 427/154; 427/255; 427/259
[58] Field of Search .............................. 437/195; 427/509, 427/510, 585, 588, 96, 154, 255, 259

[56] References Cited

U.S. PATENT DOCUMENTS

| | | | |
|---|---|---|---|
| 5,382,545 | 1/1995 | Hong | 437/195 |
| 5,596,230 | 1/1997 | Hong | 257/758 |
| 5,635,423 | 6/1997 | Huang et al. | 437/195 |
| 5,705,430 | 1/1998 | Avanzino et al. | 437/195 |
| 5,731,242 | 3/1998 | Parat et al. | 438/586 |
| 5,753,967 | 5/1998 | Lin | 257/635 |
| 5,818,110 | 10/1998 | Cronin | 257/775 |

Primary Examiner—Shrive Beck
Assistant Examiner—Paul D. Strain
Attorney, Agent, or Firm—Finnegan, Henderson, Farabow, Garrett & Dunner, L.L.P.

[57] ABSTRACT

A dual damascene processing method comprising the steps depositing sequentially a first oxide layer, a SRO layer and a second oxide layer over a substrate. Then, photolithographic and etching operations are conducted to form a via that links up with a desired wire-connecting region above the substrate. Next, another photolithographic and etching operations are conducted to form interconnect trench lines followed by the deposition of metal into the via and trench. Finally, the surface is polished with a chemical-mechanical polishing operation to remove the unwanted metal on the surface. The invention is capable of controlling the depth of trench and obtaining a smoother trench bottom for the metal lines. Furthermore, the separation of via and trench etching steps makes the control of the final etch profile much easier, thereby able to get an optimal result.

20 Claims, 6 Drawing Sheets

DUAL DAMASCENE PROCESSING METHOD

BACKGROUND OF THE INVENTION

1. Field of Invention

The present invention relates to a dual damascene processing method. More particularly, the present invention relates to a dual damascene process that can be applied to form deeper vias and narrower metallic interconnects.

2. Description of Related Art

As the level of integration for integrated circuits increases, the number of interconnects necessary for linking up devices is going to increase too. Therefore, design employing two or more metallic layers is gradually becoming the norm in the fabrication of integrated circuits. When the level of integration is further increased a high production yield and good reliability is difficult to get. Damascene processing method is a fabrication technique that involves the creation of interconnect lines by first etching a trench in a planar dielectric layer, and then filling that trench with metal. The method is capable of producing highly reliable interconnects that also has a good yield. Therefore, this method is going to be the best selection in the manufacturing industry for sub-quarter micron interconnects.

Conventional damascene processing technique has a number of problems. For example, depth of trench lines is hard to control, profile of via sidewall is difficult to standardize, and the processing window is quite narrow.

FIG. 1A and FIG. 1B are cross-sectional views showing the manufacturing steps of a first conventional dual damascene processing method. As shown in FIG. 1A, a silicon dioxide layer 12 is deposited over a substrate 11. The substrate 11 has a desired wire-connecting region 10 (the desired wire-connecting region can be a metallic layer or a silicide layer) already formed thereon. Then, photolithographic and etching processes are carried out to form a via 13 that links up with the desired wire-connecting region 10. Next, reverse metal photolithographic and etching processes are performed to create trench lines 14 and 15. After the completion of etching, metal is deposited filling the via 13 and the trenches 14 and 15. Thereafter, unwanted metallic layer on the surface is removed using a chemical-mechanical polishing process, thereby forming the cross-sectional structure as shown in FIG. 1B.

In the above damascene method, the trenches and the via structures are formed within the same oxide layer. One big disadvantage is that, since there is no etching stop layer within the oxide layer, the oxide layer can be over-etched during trench etching operation. Furthermore, since trenches are etched using a reactive ion etching method, a rough bottom surface will be formed in the trenches. However, the biggest problem is that the depths of etch for the trenches are difficult to control, thereby leading to vastly different metal interconnect line thickness.

FIG. 2A and FIG. 2B are cross-sectional views showing the manufacturing steps of a second conventional dual damascene processing method. In this second double damascene method, a silicon nitride layer is formed in the middle of the oxide layer to act as an etching stop layer. Thus, unlike the first dual damascene method, the defect of over-etching due to the absence of a stop layer is prevented. First, as shown in FIG. 2A, a first oxide layer 23 is deposited over a substrate 22. The substrate 22 has a desired wire-connecting region 21 already formed thereon. Then, a silicon nitride layer 25 that has a via opening 24 is formed over the first oxide layer and established a structure as shown in FIG. 2A.

Next, as shown in FIG. 2B, a second oxide layer 26 is deposited over the silicon nitride layer 25. This is followed by photolithographic and etching processes for forming the trenches. Due to the presence of a silicon nitride layer 25, after etching out trenches 27 and 28, etching will not continue down once the stop layer is reached. Only in places where a via opening 24 has formed in the silicon nitride layer 25, will the etching continues down until the desired wire-connecting region 21 is reached forming a via 29 as shown in FIG. 2B. Subsequently, metal is deposited filling the trenches 27, 28 and via 29 until they are completely filled. Thereafter, unwanted metal on the oxide surface is removed using a chemical-mechanical polishing method. Then, subsequent processes are carried out. Although this method can control the trench depth, there are some other problems too. The first problem is that the silicon nitride layer, which is used as a stop layer, has a rather large dielectric constant K, thereby increasing the parasitic capacitance of the interconnect lines. Furthermore, the etchant used in the etching must have a high silicon nitride/silicon dioxide selectivity ratio. Another problem is the narrow processing window. During photolithographic and etching operations, if the photomask is not properly aligned, the etching region will be shifted. The situation is depicted in FIG. 3. In FIG. 3, a substrate 31 having a desired wire-connecting region 30 already formed thereon is provided. Then, a first oxide layer 32, a silicon nitride layer 33 that has a via opening, and a second oxide layer 34 are sequentially formed over the substrate 31. Next, photolithographic and etching operations are performed. Width of the trench 35 remains unchanged. However, due to a moderate shift of photomask to the right, position of the etching region is correspondingly shifted thereby leading to a narrowing of the via 36. When metal is ultimately filled, contact area between the metal and the desired wire-connecting region will be reduced. A smaller contact area will increase the contact resistance between connecting wires. Therefore, this method has a narrow processing window and will increase the level of difficulty in processing.

In light of the foregoing, there is a need in the art to provide an improved dual damascene processing method.

SUMMARY OF THE INVENTION

Accordingly, the present invention is directed to provide a dual damascene processing method that uses a silicon-rich oxide (SRO) stop layer during etching for easy control of trench depth and to obtain a smooth trench bottom.

In another aspect, the present invention is directed to provide a dual damascene processing method that does not need an etchant having a high silicon nitride/silicon dioxide selectivity ratio. Furthermore, the SRO layer has a dielectric constant that is lower than silicon nitride. Therefore, there is no need to worry about the problem of parasitic capacitance between interconnects.

In a further aspect, the present invention is directed to provide a dual damascene processing method that can avoid the problems due to the misalignment of photomask. Misalignment of photomask causes a reduction in via size that may lead to a decrease in contact area. A small contact area will result in high contact resistance. Therefore, a wider processing window needs to be provided.

To achieve these and other advantages and in accordance with the purpose of the invention, as embodied and broadly described herein, the invention provides a double damascene processing method. The method comprises the steps of providing a substrate having a desired wire-connecting region formed thereon, then forming a first oxide layer, a SRO layer and a second oxide layer sequentially over the substrate. Thereafter, photolithographic and etching operations are performed to form a via that links up with the desired wire-connecting region above the substrate. Next, another photolithographic and etching operations are performed to form interconnect trench line using the SRO layer as a stop layer. Finally, metal is deposited filling the via and trench. This is followed by polishing the surface with a chemical-mechanical polishing operation to remove the unwanted metal on the surface, thereby getting ready for subsequent processes. Using the SRO layer as a stop layer, the desired trench depths can be easily attained and a smoother trench bottom can be obtained. In addition, since vias and trenches are etched in two separate etching steps, the selectivity ratio of etchant with regard to silicon dioxide/SRO need not be very high. Another advantage is that the dielectric constant of a SRO layer is lower than the dielectric constant of a silicon nitride layer. Therefore, there is no need to worry about the increase in parasitic capacitance in this invention. A further advantage of this invention is that the use of dry etching technique serves to maintain proper control over the depth of vias and sidewall profile of the trenches. Furthermore, because the via is formed before the trench rather than in a single process, size of via will not be reduced due to a misalignment of the photomask. Therefore, contact resistance will not increase, and a larger processing window can be provided. The most important point is that the method of this invention can be applied repeatedly to produce a multi-layered interconnect structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

FIG. 4E is a cross-sectional view showing the structure that results from a shift in the photomask alignment according to the preferred embodiment of this invention.

DESCRIPTION OF THE PREFERRED EMBODIMENTS

Figure 1A:
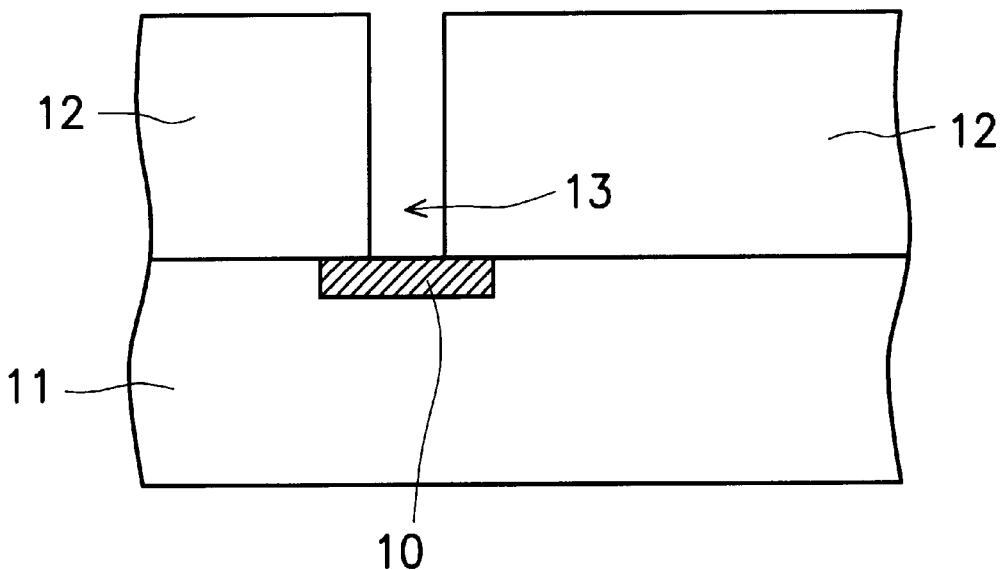
FIG. 1A and FIG. 1B are cross-sectional views showing the manufacturing steps of a first conventional dual damascene processing method.
Figure 1B:
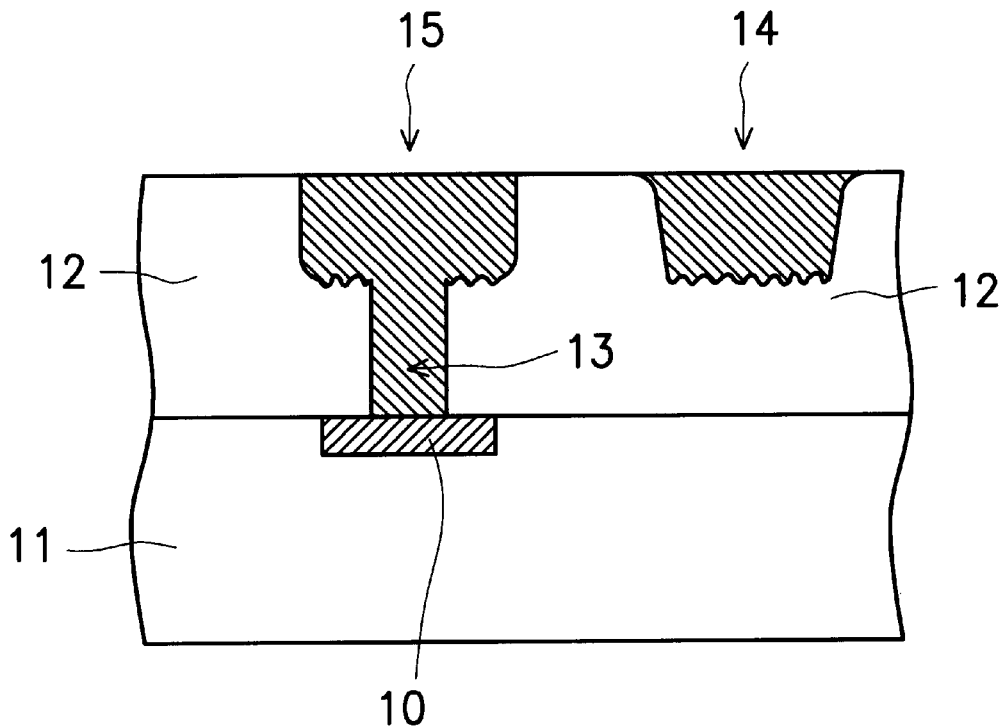
Figure 2A:
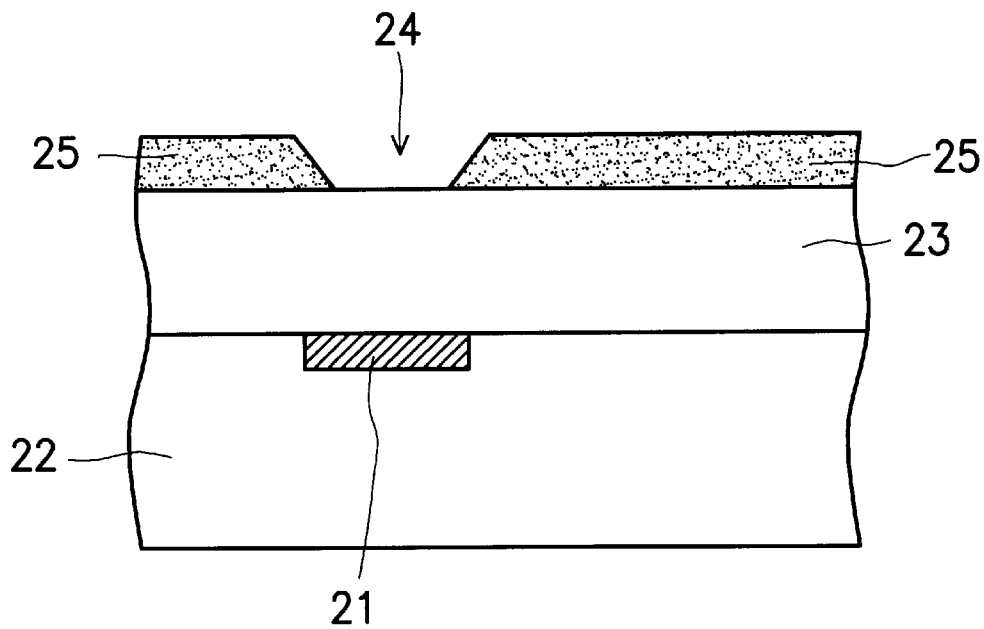
FIG. 2A and FIG. 2B are cross-sectional views showing the manufacturing steps of a second conventional dual damascene processing method.
Figure 2B:
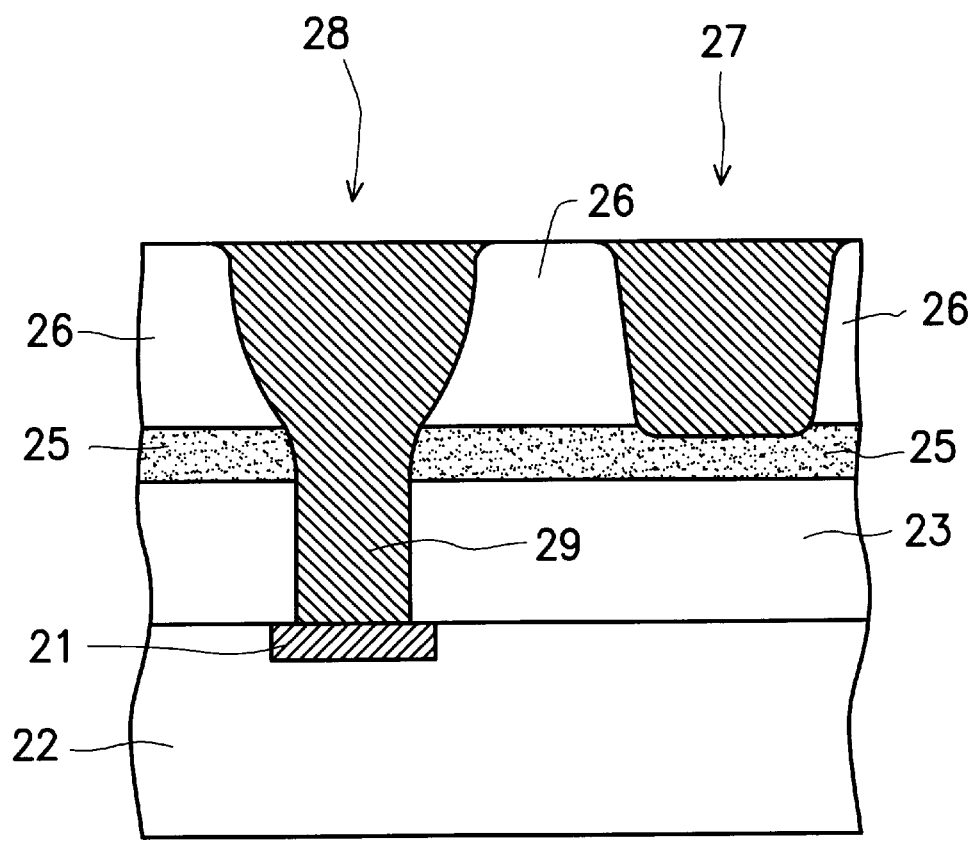
Figure 3:
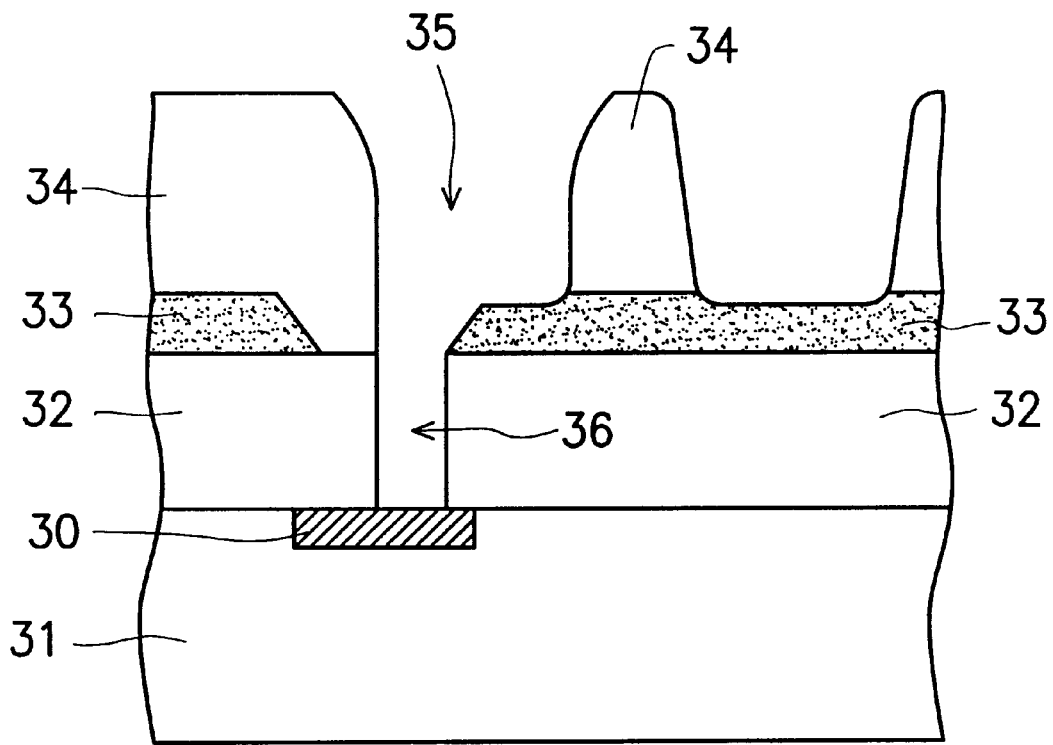
FIG. 3 is a cross-sectional view showing the structure that results from a shift in the photomask in the second conventional dual damascene processing method.

Reference will now be made in detail to the present preferred embodiments of the invention, examples of which are illustrated in the accompanying drawings. Wherever possible, the same reference numbers are used in the drawings and the description to refer to the same or like parts.

Figure 4A:
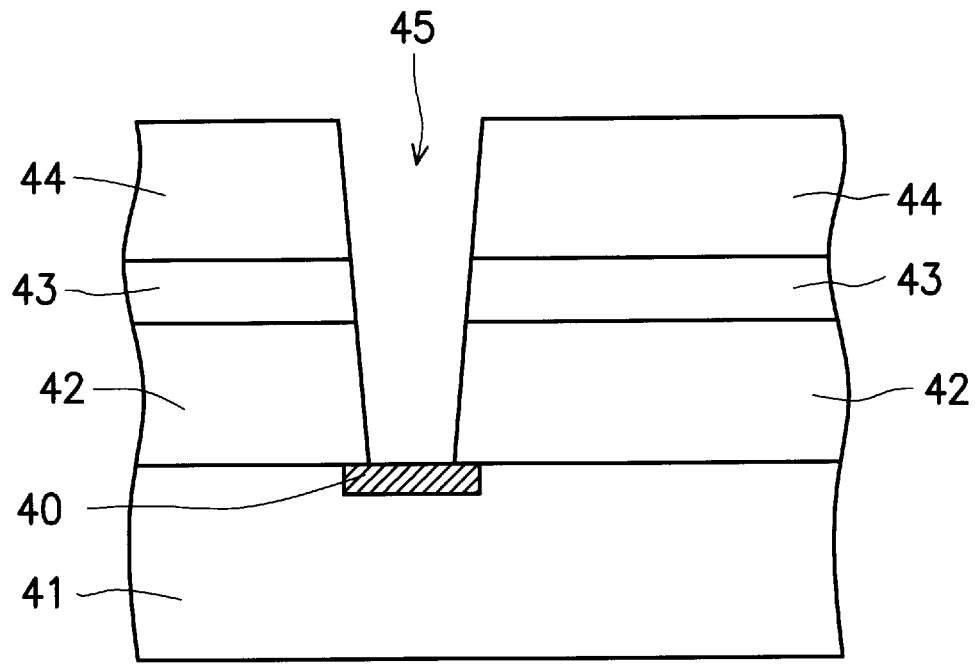
FIGS. 4A through 4E are cross-sectional views showing the progression of manufacturing steps using a dual damascene process according to one preferred embodiment of this invention.
Figure 4B:
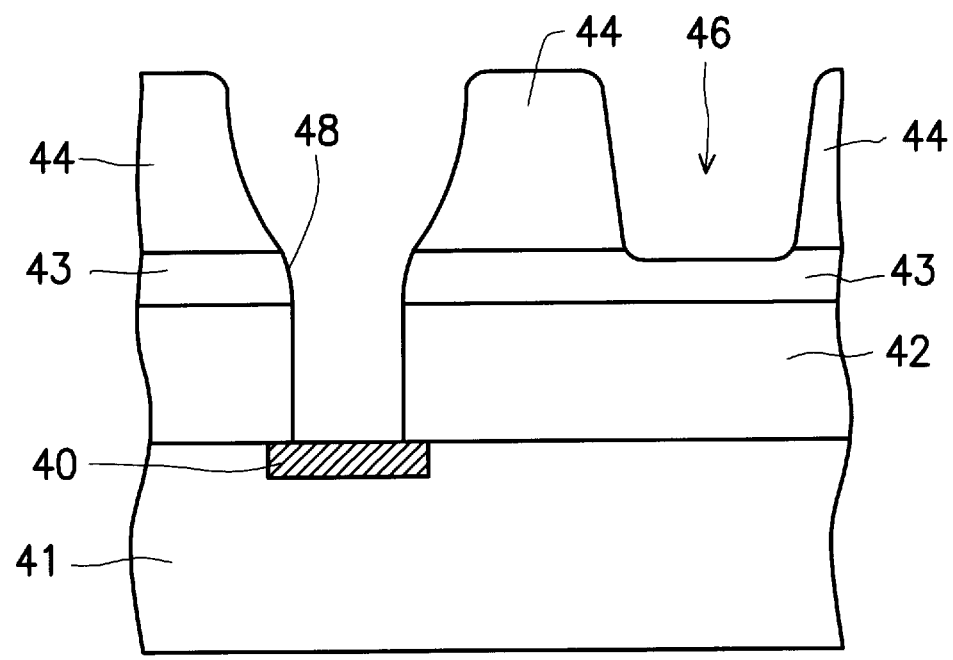
Figure 4C:
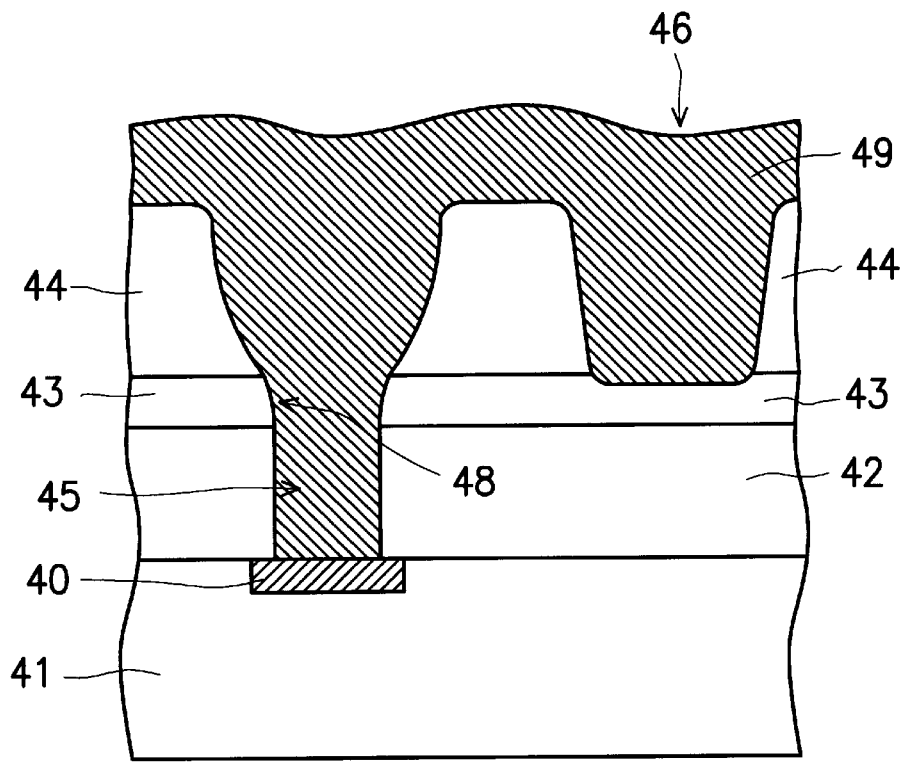
Figure 4D:
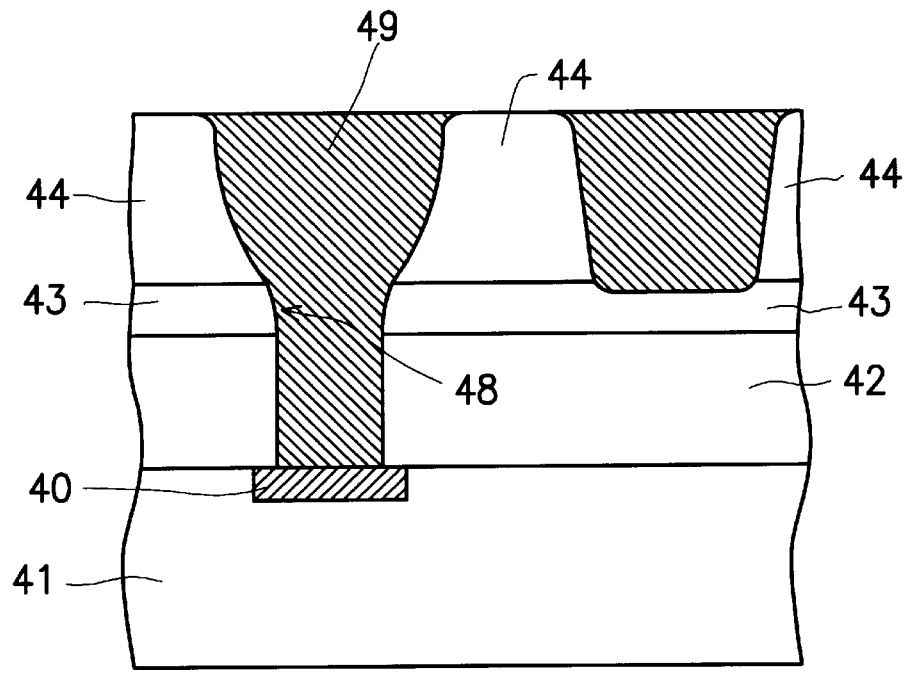
Figure 4E:
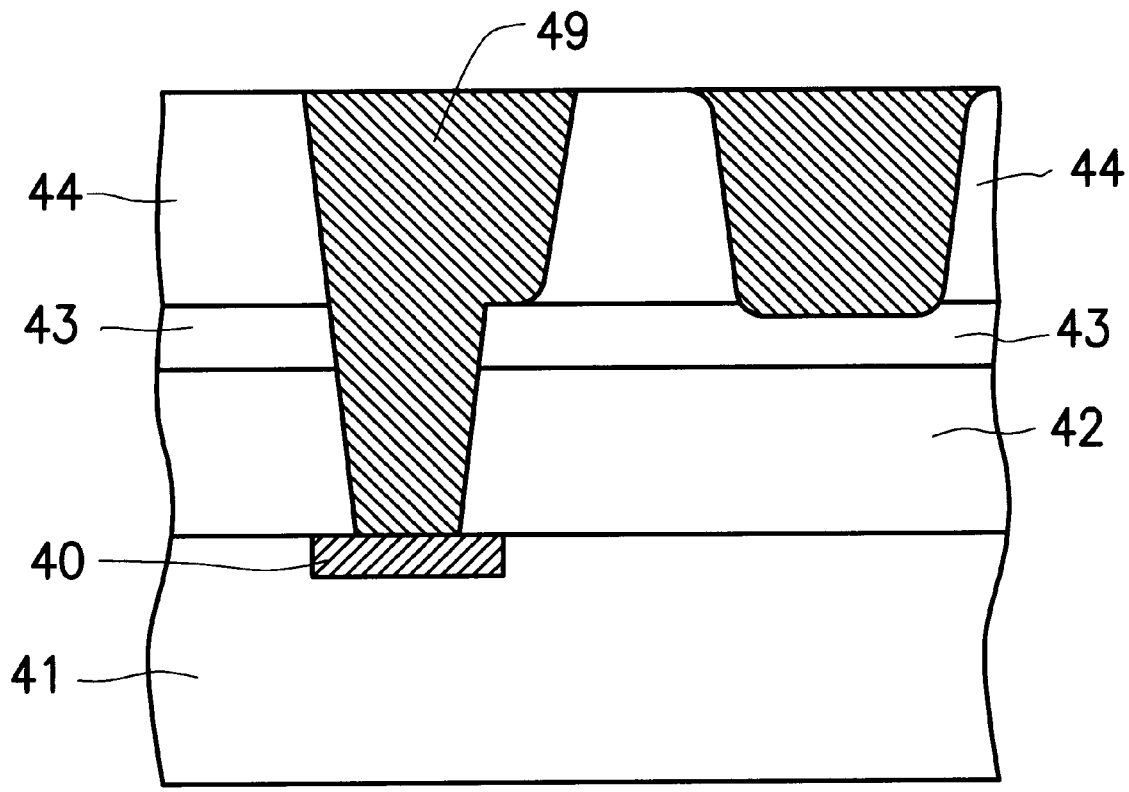

FIGS. 4A through 4E are cross-sectional views showing the progression of manufacturing steps using a dual damascene process according to one preferred embodiment of this invention. First, as shown in FIG. 4A, a first oxide layer 42 is deposited over a substrate 41. The substrate 41 has a desired wire-connecting region 40 already formed thereon, and the first oxide layer 42 serves as an internal dielectric layer. Then, a silicon-rich oxide (SRO) layer 43 is deposited over the first oxide layer 42 using a plasma-enhanced vapor deposition (PECVD) method, for example. The SRO layer 43 serves as a stop layer, and preferably has a thickness of between 1000 Å to 2000 Å. After that, a second oxide layer 44 is deposited over the SRO layer 43. In the subsequent step, photolithographic and etching processes are performed to create a via 45 exposing the desired wire-connecting region 40. Next, as shown in FIG. 4B, another photolithographic and etching processes are carried out to form trenches. The second oxide layer 44 is etched until the SRO layer 43, which functions as a stop layer, is reached. Upon reaching the stop layer, etching stops resulting in a trench 46. A smooth profile 48 is also obtained inside the via 45 in the exposed surface of the SRO layer 43. The smooth profile 48 enables a smooth filling of metal into the via 45 in subsequent processing. Next, as shown in FIG. 4C, metal 49 is deposited filling the via 45 and trench 46. Subsequently, the unwanted metal on the surface is removed, for example, using a chemical-mechanical polishing operation to form the final structure as shown in FIG. 4D. Because two separate etching operations are conducted, even if there is misalignment in the photomask during trench forming photolithographic and etching operations, the resulting structure is at worst that shown in FIG. 4E. The result of a photomask misalignment only shows itself up in the second oxide layer 44. Since the via 45 has been formed in a previous etch, it is not affected by any photomask misalignment. Hence, beside the size of the via 45 that links up with the desired wire-connecting region 40 remains unchanged, the area of contact between the metal inside the via 45 and the desired wire-connecting region 40 also remains unchanged. Therefore, there will not be any overall change in contact resistance.

Because of the presence of a SRO stop layer between the first oxide layer and the second oxide layer, trench depths are more easily controlled. In addition, since the via is formed by etching through oxide layers, the via thus formed is almost a vertical shaft. In other words, the largest contact area can be obtained between the filled metal and the substrate, thereby leading to a smaller contact resistance (wherein, the substrate can be a metal or silicide layer). Furthermore, the sloping edge of the SRO layer improves the process of filling metal into the via and thus obtaining a better coating result.

Consequently, the characteristic of this invention is the sequential formation of a first oxide layer, a SRO layer and a second oxide layer. Then, photolithographic and etching operations are conducted to form vias that connect with the desired wire-connecting regions. Thereafter, photolithographic and etching operations are again conducted to form trenches using the SRO layer as a stop layer. Finally, metal is deposited into the trenches and vias, and then the unwanted metallic layer is removed. Using the SRO layer as a stop layer, the desired trench depths can be easily attained and a smoother trench bottom can be obtained. In addition, since vias and trenches are etched in two separate etching steps, the selectivity ratio of etchant with regard to silicon dioxide/SRO need not be very high. Another advantage is that the dielectric constant of a SRO layer is lower than the dielectric constant of a silicon nitride layer. Therefore, there is no need to worry about the increase in parasitic capacitance in this invention. A further advantage of this invention is that the use of dry etching technique serves to maintain proper control over the depth of vias and sidewall profile of the trenches. Furthermore, contact resistance will not increase due to the misalignment of photomask, hence a larger processing window can be provided. The most important point is that the method of this invention can be applied repeatedly to produce a multi-layered interconnect structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual damascene processing method comprising the steps of:
    (a) forming a first oxide layer over a substrate having a desired wire-connecting region formed thereon;
    (b) forming a silicon-rich oxide layer for preventing a parasitic capacitance over the first oxide layer;
    (c) forming a second oxide layer over the silicon-rich oxide layer;
    (d) removing portions of the first oxide layer, the silicon-rich oxide layer and the second oxide layer to form a via exposing the desired wire-connecting region;
    (e) using the silicon-rich oxide layer as a stop layer, subsequently removing portions of the second oxide layer to form at least one interconnect trench line and widening the via in the second oxide layer, the exposed surface of the silicon-rich oxide layer in the via having a smooth sloping edge; and
    (f) depositing a first metal to fill the via and the interconnect trench line, the first metal directly connecting the desired wire-connecting region through the second oxide layer, the silicon-rich oxide layer and the first oxide layer.

2. The method of claim 1, wherein the desired wire-connecting region is a region with a second metal.

3. The method of claim 1, wherein the desired wire-connecting region includes a silicide.

4. The method of claim 1, wherein the silicon-rich oxide layer has a thickness of about 1000 Å to 2000 Å.

5. The method of claim 1, wherein the step of forming the silicon-rich oxide layer includes using plasma-enhanced chemical vapor deposition.

6. The method of claim 1, wherein the trench has a depth equal to the thickness of the second oxide layer.

7. The method of claim 1, wherein after depositing the first metal into the via and trench, further includes removing the first metal that protrudes above the via and trench.

8. The method of claim 7, wherein the step of removing the protruded first metal includes using chemical-mechanical polishing.

9. The method of claim 1, wherein the method further includes repeating the steps on a plurality of conducting layers to form a multi-layered interconnect structure.

10. The method of claim 1, wherein step (d) further includes the substeps of:
    forming a photoresist layer over the second oxide layer;
    patterning with a mask, and then removing portions of the first oxide layer, the silicon-rich oxide layer and the second oxide layer to form via exposing the desired wire-connecting region; and
    removing the photoresist layer.

11. The method of claim 1, wherein step (e) further includes the substeps of:
    forming a photoresist layer over the second oxide layer;
    patterning with a mask, and using the silicon-rich oxide layer as a stop layer, removing portions of the second oxide layer to form the trench; and
    removing the photoresist layer.

12. A dual damascene processing method comprising the steps of:
    (a) forming a first oxide layer over a substrate having a desired wire-connecting region formed thereon;
    (b) forming a silicon-rich oxide layer for preventing a parasitic capacitance over the first oxide layer;
    (c) forming a second oxide layer over the silicon-rich oxide layer;
    (d) forming a first photoresist layer over the second oxide layer;
    (e) removing portions of the first oxide layer, the silicon-rich oxide layer and the second oxide layer to form a via exposing the desired wire-connecting region;
    (f) removing the first photoresist layer;
    (g) forming a second photoresist layer over the second oxide layer;
    (h) using the silicon-rich oxide layer as a stop layer, subsequently removing portions of the second oxide layer to form at least one interconnect trench line and widening the via in the second oxide layer, the exposed surface of the silicon-rich oxide layer in the via having a smooth sloping edge;
    (i) removing the second photoresist layer; and
    (j) depositing a first metal to fill the via and the interconnect trench line, the first metal directly connecting the desired wire-connecting region through the second oxide layer, the silicon-rich oxide layer and the first oxide layer.

13. The method of claim 12, wherein the desired wire-connecting region is a region with a second metal.

14. The method of claim 12, wherein the desired wire-connecting region includes a silicide.

15. The method of claim 12, wherein the silicon-rich oxide layer has a thickness of about 1000 Å to 2000 Å.

16. The method of claim 12, wherein the step of forming the silicon-rich oxide layer includes using plasma-enhanced chemical vapor deposition.

17. The method of claim 12, wherein the trench has a depth equal to the thickness of the second oxide layer.

18. The method of claim 12, wherein after depositing the first metal into the via and trench, further includes removing the first metal that protrudes above the via and trench.

19. The method of claim 18, wherein the step of removing the protruded first metal includes using chemical-mechanical polishing.

20. The method of claim 12, wherein the method further includes repeating the steps on a plurality of conducting layers to form a multi-layered interconnect structure.

* * * * *